United States Patent
Kao et al.

(10) Patent No.: US 9,666,441 B2
(45) Date of Patent: May 30, 2017

(54) SEMICONDUCTOR DEVICE AND METHOD OF MANUFACTURE

(71) Applicants: Taiwan Semiconductor Manufacturing Company, Ltd., Hsin-Chu (TW); National Taiwan University, Taipei (TW)

(72) Inventors: Cheng-Heng Kao, Taipei (TW); Samuel C. Pan, Hsin-Chu (TW); Chi-Wen Liu, Hsin-Chu (TW); Miin-Jang Chen, Taipei (TW); Po-Shuan Yang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/852,818

(22) Filed: Sep. 14, 2015

(65) Prior Publication Data
US 2017/0018435 A1    Jan. 19, 2017

Related U.S. Application Data

(60) Provisional application No. 62/194,008, filed on Jul. 17, 2015.

(51) Int. Cl.
*H01L 21/308*    (2006.01)
*H01L 21/266*    (2006.01)

(52) U.S. Cl.
CPC ........ *H01L 21/3086* (2013.01); *H01L 21/266* (2013.01); *H01L 21/3081* (2013.01)

(58) Field of Classification Search
None
See application file for complete search history.

(56) References Cited

U.S. PATENT DOCUMENTS

| | | | |
|---|---|---|---|
| 5,306,601 A * | 4/1994 | Hashimoto | B82Y 10/00 250/492.1 |
| 5,439,763 A * | 8/1995 | Shimase | G03F 1/26 250/492.2 |
| 5,807,650 A * | 9/1998 | Komano | G03F 1/26 430/5 |
| 5,882,825 A * | 3/1999 | Kurihara | G03F 1/30 430/5 |
| 5,914,204 A * | 6/1999 | Lee | G03F 1/34 430/5 |
| 6,222,210 B1 * | 4/2001 | Cerny | H01L 21/8252 257/194 |
| 2007/0269957 A1 * | 11/2007 | Cha | H01L 21/76243 438/423 |
| 2008/0160431 A1 * | 7/2008 | Scott | B82Y 10/00 430/5 |
| 2014/0065737 A1 * | 3/2014 | Ninomiya | H01J 37/304 438/17 |

\* cited by examiner

*Primary Examiner* — Allan Olsen
(74) *Attorney, Agent, or Firm* — Slater Matsil, LLP

(57) ABSTRACT

A semiconductor device and method of manufacturing are presented in which features of reduced size are formed using an irradiated mask material. In an embodiment a mask material that has been irradiated with charged ions is utilized to focus a subsequent irradiation process. In another embodiment the mask material is irradiated in order to reshape the mask material and reduce the size of openings formed within the mask material. Through such processes the limits of photolithography may be circumvented and smaller feature sizes may be achieved.

20 Claims, 13 Drawing Sheets

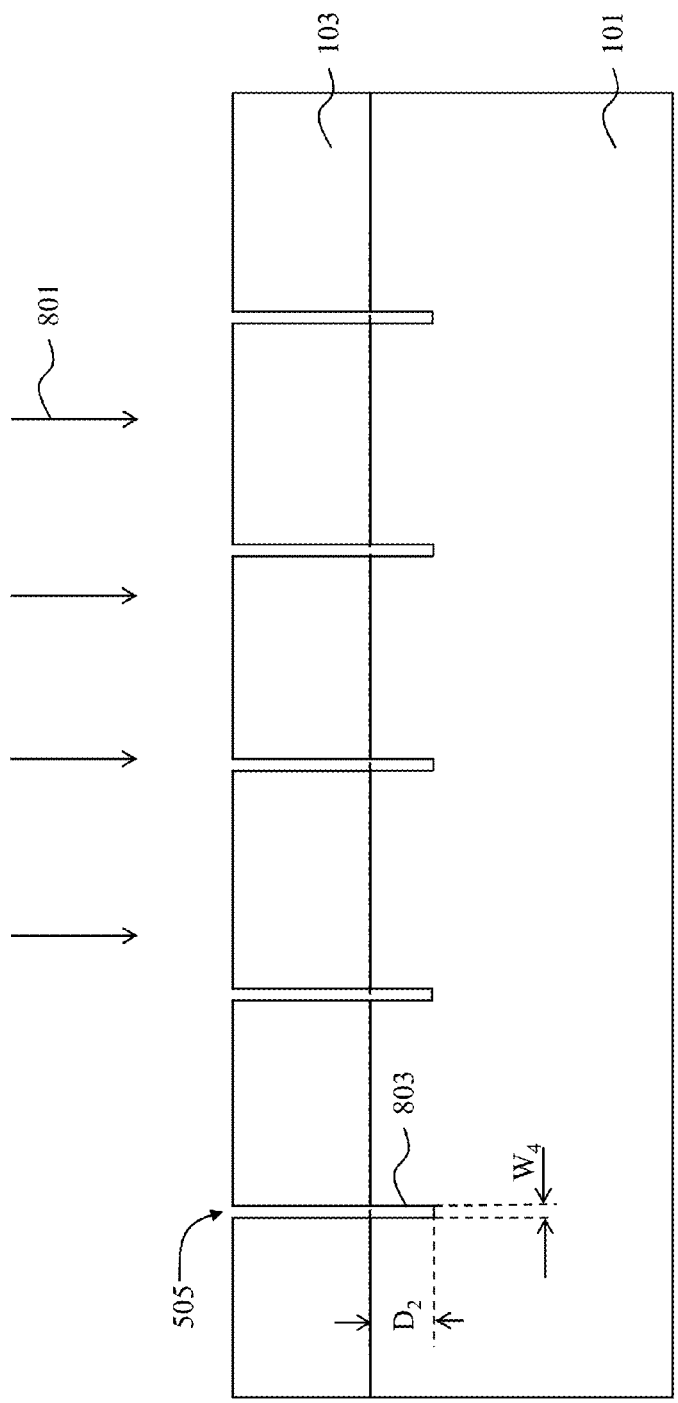

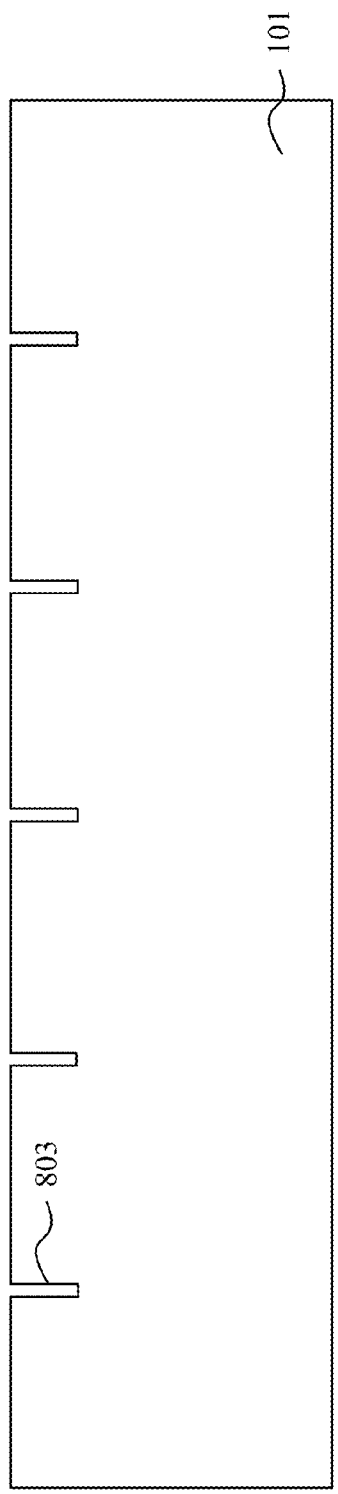

SEMICONDUCTOR DEVICE AND METHOD OF MANUFACTURE

This application claims priority to and the benefit of U.S. Provisional Application No. 62/194,008, filed on Jul. 17, 2015, entitled "Semiconductor Device and Method of Manufacture," which application is hereby incorporated herein by reference in its entirety.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Dramatic improvements have been made in lithography, which has resulted in considerable improvement in 2D IC formation. However, further improvements in lithography and the processes that utilize lithography are needed in order to further reduce the size of devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 illustrates an extension of the openings into the substrate in accordance with some embodiments.

FIG. 9 illustrates a removal of the mask material in accordance with some embodiments.

DETAILED DESCRIPTION

Figure 1:
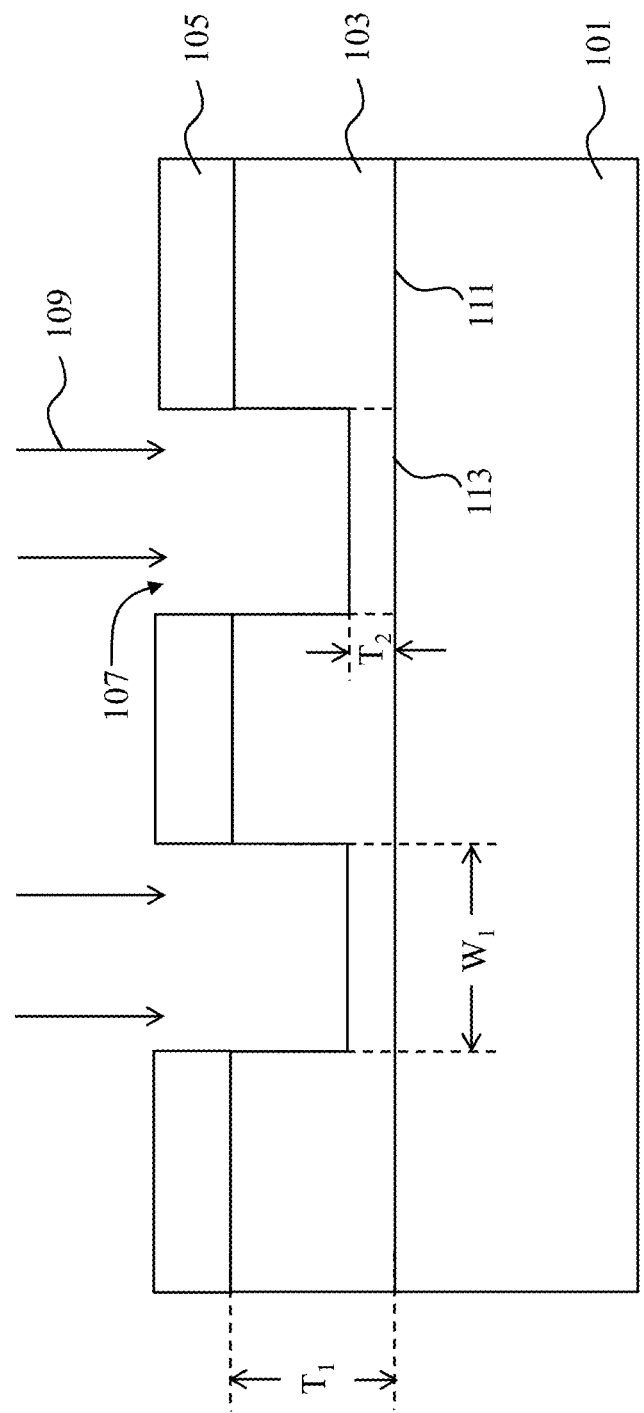
FIG. 1 illustrates a patterning of a mask material over a substrate in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, a substrate 101 to be patterned is illustrated along with a first mask material 103 formed over the substrate 101. In an embodiment the substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, glass substrates, ceramic substrates, or hybrid orientation substrates.

Alternatively, the substrate 101 may comprise a dielectric material into which conductive structures are desired to be placed in order to, e.g., route electrical connections. In this embodiment the substrate 101 may comprise one or more low-k dielectric materials that may be deposited using, e.g., a chemical vapor deposition (CVD) process, a plasma enhanced chemical vapor deposition (PECVD) process, an atomic layer deposition (ALD) process, physical vapor deposition (PVD), a spin on process, or the like. Alternatively, the dielectric material deposited in this embodiment may be deposited by initially depositing a dielectric material and a porogen, and then removing the porogen to form pores within the dielectric material. Any suitable material or method of manufacture may be used to form the dielectric material, and all such materials and processes are fully intended to be included within the scope of the embodiments.

In yet another embodiment the substrate 101 may be a conductive material that is intended to be patterned and to help route electrical connections. In this embodiment the substrate 101 may comprise one or more conductive materials, such as aluminum, tungsten, copper, nickel, gold, combinations of these, or the like, formed using any suitable process, such as a chemical vapor deposition (CVD) process, a plasma enhanced chemical vapor deposition (PECVD) process, an atomic layer deposition (ALD) process, physical vapor deposition (PVD), plating, or the like. Any suitable conductive material and method of formation may alternatively be utilized.

Additionally, while specific embodiments of the substrate 101 are discussed above (e.g., a semiconductor material, a dielectric, and a conductor), these examples are intended to be illustrative and are not intended to be limiting upon the present embodiments. Rather, any suitable material formed using any suitable process that is desired to be patterned may be utilized. All such materials are fully intended to be included within the scope of the embodiments.

The first mask material 103 is formed over the substrate 101 and will be used, as described further below, as both a mask and a lens in order to pattern the underlying substrate 101. In an embodiment the first mask material 103 is a hard material that can withstand the subsequent processing without appreciable bending. For example, the first mask material 103 may be a material with a Young's modulus of greater than about 344.83 GPa (at room temperature), and may be, for example, aluminum oxide ($Al_2O_3$) or zirconium oxide ($ZrO_2$), although any suitable material may alternatively be utilized.

The first mask material 103 may be formed using a deposition process such as chemical vapor deposition (CVD), plasma enhanced chemical vapor deposition (PECVD), physical vapor deposition (PVD), atomic layer deposition (ALD), combinations of these, or the like. In a particular embodiment in which the first mask material 103 is aluminum oxide, the first mask material 103 may be formed using ALD (with, e.g., a Savannah S100 machine from Cambridge nanotech) using trimethylaluminum (TMA, $Al(CH_3)_3$) and $H_2O$ as precursor materials. In an embodiment the first mask material 103 is formed to an initial first thickness $T_1$ of greater than about 100 nm, such as about 300 nm. However, any suitable deposition process to any suitable thickness may alternatively be utilized.

FIG. 1 also illustrates a patterning of the first mask material 103 into a first region 111 with the first thickness $T_1$ and also into a second region 113 (illustrated within FIG. 1 as being separated from the first region 111 by the dashed lines) with a second thickness $T_2$. In an embodiment the first mask material 103 is patterned using, for example, a masking and etching process, whereby a pattern material 105, such as a photosensitive material, is applied to the first mask material 103 and then exposed to a patterned energy source in order to induce a chemical reaction in those portions of the patterned material 105 that were exposed to the patterned energy source. After the physical properties of those portions of the patterned material 105 exposed to the patterned energy source have been modified, the patterned material 105 is developed to separate the exposed portion from the unexposed portion, thereby transferring the pattern of the patterned energy source into the patterned material 105.

In another embodiment the patterned material 105 may be an e-beam resist such as ZEP-520A. In this embodiment the e-beam resist, after being applied to the first mask material 103, is exposed with scanning electron beams in an e-beam lithography process which may use, e.g., a ELD 7000 from Elionix. Once the e-beam resist has been scanned, it may be developed (using, e.g., ZEP-N50) in order to remove the exposed portions from the unexposed portions.

The patterned material 105 is patterned to have first openings 107 that will be used to pattern the first mask material in an area over the substrate 101 where second openings 303 (not illustrated in FIG. 1 but illustrated and discussed below with respect to FIG. 3) will be formed. The first openings 107 may have a first width $W_1$ that is obtainable through photolithographic processes, such as being less than about 200 nm, such as by being less than about 100 nm. However, any suitable width may alternatively be utilized.

Once the patterned material 105 has been patterned to have the first openings 107, the patterned material 105 may be used as a mask to transfer the pattern of the patterned material 105 into the first mask material 103. In an embodiment the first transfer process (represented in FIG. 1 by the arrows labeled 109) may be performed using, e.g., an ion beam milling process. In an embodiment the first transfer process 109 may utilize ions such as gallium, neon, combinations of these, or the like. However, any suitable ion may alternatively be utilized.

In an embodiment utilizing gallium ions, the gallium ions may be directed towards the first mask material 103 using, e.g., an ion beam process whereby the gallium ions are extracted from a precursor material and then directed, accelerated, and focused towards the first mask material 103. For example, a precursor material such as a gaseous, liquid or solid gallium containing compound such as liquid gallium may be ionized (using, e.g., a plasma chamber, not shown) in order to generate a beam of gallium ions.

The beam of gallium ions may then be directed towards a mass analysis magnet in order to electromagnetically separate those ions having a desired charge-to-mass ratio from those having an undesired charge-to-mass ratio. Once a coherent ion beam of gallium ions is obtained, the coherent ion beam is sent to a linear accelerator. The linear accelerator is used to impart additional energy to the coherent ion beam as it passes through the linear accelerator. The linear accelerator imparts this additional energy using a series of electrodes (not shown) that generate an electromagnetic field which, when the coherent ion beam passes through the field, works to accelerate the coherent ion beam. In an embodiment the ion beam may be accelerated to an energy of between about 5 KeV and about 100 KeV, such as about 30 KeV.

In an embodiment the coherent ion beam may be directed towards the first mask material 103 as a spot exposure which scans across the first mask material 103 in order to expose different portions of the first mask material 103 at different times. The coherent ion beam may be directed towards the first mask material 103 with a milling spot size of about 133 nm, a scanning area of about 3600 $\mu m^2$, and a beam current of between about 40 picoampere (pA) and 60 nA, such as about 2.5 nA. The time of exposure may be set so as to avoid any undesired melting of the material of the first mask material 103 at this point of the process. For example, in an embodiment in which the first mask material 103 is $Al_2O_3$ (with a melting point of 2000° C. with a 30° C. error), the time may be set at less than about 10 minutes.

In another embodiment, an anisotropic etching process, such as a reactive ion etch process, may be used to transfer the pattern of the patterned material 105 into the first mask material 103. As such, while the precise etchants utilized are dependent at least in part upon the material chosen for the first mask material 103, in an embodiment in which the first mask material 103 is aluminum oxide, the first transfer process 109 may utilize etchants such as $CF_4$ and oxygen in order to transfer the pattern of the patterned material 105 into the first mask material 103.

In yet another embodiment, a dual beam focused ion beam system, such as a FEI Helios Nanolab 600i dual beam focused ion beam system, may be utilized in an ion beam sputtering process to directly pattern the first mask material 103 (without the patterning material 105). In this embodiment a ion beam, such as a gallium ion beam, is formed using, e.g., a FEI Helios Nanolab 600i dual beam focused ion beam system, and then the gallium ion beam is scanned across the first mask material 103 in order to mill the first mask material 103 and form the first openings 107.

However, in an embodiment the first transfer process 109 will transfer the pattern of the patterned material 105 into the first mask material 103 without etching all of the way through the first mask material 103. Rather, the first region 111 will retain the original first thickness $T_1$ while the second region 113 will have the first thickness $T_1$ be reduced to a second thickness $T_2$, without fully removing the first mask material 103 within the second region 113. As such, the second region 113 will have the second thickness $T_2$ of less than the first thickness $T_1$, such as by being less than about 200 nm.

In an embodiment, in order to achieve the reduced second thickness $T_2$, the first transfer process 109 may be a timed transfer process. Such a process allows for good control of the second thickness $T_2$ without introducing additional complications to the process. In an embodiment in which the first mask material 103 is aluminum oxide and the transfer process utilizes the etchants such as $CF_4$ and oxygen, the first transfer process 109 may be performed for a time of about 1.5 minutes.

In another embodiment the second region 113 may be completely removed (e.g., have a second thickness $T_2$ of zero). In this embodiment the first transfer process 109 may be continued until all of the first mask material 103 in the second region 113 is removed and the substrate 101 underlying the second region 113 has been exposed.

Figure 2:
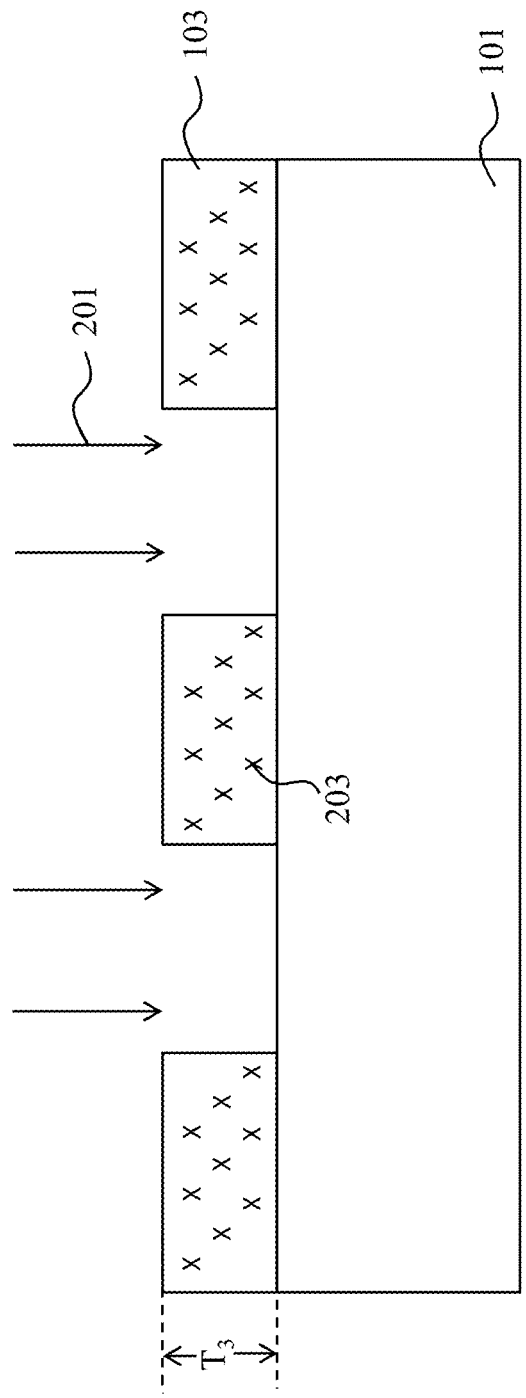
FIG. 2 illustrates an irradiation of the mask material in accordance with some embodiments.

FIG. 2 illustrates a removal of the patterned material 105 and a first irradiation (represented in FIG. 2 by the arrows labeled 201) of the first mask material 103. In an embodiment the patterned material 105 may be removed using, e.g., an ashing process, whereby the temperature of the patterned material 105 is increased to a point where the patterned material 105 will undergo a thermal decomposition and is then easily removed from the first mask material 103. However, any other suitable removal process, such as a wet etch, may alternatively be used to strip the patterned material 105.

Once the patterned material 105 has been removed, the first irradiation process 201 may be performed in order to implant charged ions (represented in FIG. 2 by the Xs labeled 203) into the first region 111 of the first mask material 103 as well as to remove the second region 113 of the first mask material 103. In an embodiment the first irradiation process 201 may implant ions that will charge the first mask material 103 and will be used to create a self-focused lens for a second irradiation process 301 (not illustrated in FIG. 2 but illustrated and described further below with respect to FIG. 3), such as gallium, neon, combinations of these, or the like. However, any suitable charged ion may alternatively be utilized.

In an embodiment the charged ions 203 may be directed towards the first mask material using, e.g., an ion beam process whereby the charged ions (e.g., gallium ions) are extracted from a precursor material and then directed, accelerated, and focuses towards the first mask material 103 in a scanning type of operation similar to the ion beam milling process described above with respect to FIG. 1. For example, in an embodiment in which gallium is the desired ion, a precursor material such as a gaseous, liquid or solid gallium containing compound such as liquid gallium may be ionized (using, e.g., a plasma chamber, not shown) in order to generate a beam of gallium ions.

The beam of gallium ions may then be directed towards a mass analysis magnet in order to electromagnetically separate those ions having a desired charge-to-mass ratio from those having an undesired charge-to-mass ratio. Once a coherent ion beam of gallium ions is obtained, the coherent ion beam is sent to a linear accelerator. The linear accelerator is used to impart additional energy to the coherent ion beam as it passes through the linear accelerator. The linear accelerator imparts this additional energy using a series of electrodes (not shown) that generate an electromagnetic field which, when the coherent ion beam passes through the field, works to accelerate the coherent ion beam. In an embodiment the ion beam may be accelerated to an energy of between about 5 KeV and about 100 KeV, such as about 30 KeV.

In an embodiment the coherent ion beam may be directed towards the first mask material 103 as a spot exposure which scans across the first mask material 103 in order to expose different portions of the first mask material 103 at different times. The coherent ion beam may be directed towards the first mask material 103 with a milling spot size of about 133 nm, a scanning area of about 3600 $\mu m^2$, a beam current of between about 40 picoampere (pA) and 60 nA, such as about 2.5 nA. The time of exposure may be set so as to avoid any undesired melting of the material of the first mask material 103 at this point of the process. For example, in an embodiment in which the first mask material 103 is $Al_2O_3$ (with a melting point of 2000° C. with a 30° C. error), the time may be set at less than about 10 minutes.

By utilizing these types of process conditions during the first irradiation process 201, multiple things will occur as the first mask material is impacted by the desired ions. In one instance, the charged ions 203 will both work to remove a top portion of the first region 111 of the first mask material 103 (without removing all of the first mask material 103 within the first region 111) and will also impact with the first region 111 and become implanted within the first region 111. For example, in an embodiment the charged ions 203 will be implanted within the first region 111 of the first mask material 103 to a concentration of about 60.37 $pC/\mu m^2$ (for a two minute irradiation) and about 301.84 $pC/\mu m^2$ (for a ten minute irradiation), although the concentration may be raised until the gap coalesces, such as such as about 603.68 $pC/\mu m^2$.

Additionally during the first irradiation process 201, the coherent ion beam will also impact and remove the materials exposed to the first irradiation process 201. As such, in one embodiment, to protect the substrate 101 during the first irradiation process 201, the second region 113 was specifically retained in the second region 113 over the substrate 101. However, during the first irradiation process 201, the second region 113 is etched and removed by the ion beam and the underlying the portion of the substrate 101 is exposed without fully removing the first region 111 of the first mask material 103.

During this removal, the first region 111 of the first mask material 103 (which had originally had the first thickness $T_1$) is similarly thinned, but not removed from over the substrate 101. As such, the first region 111 after the first irradiation process 201 may have a third thickness $T_3$ of greater than about 50 nm. However, any suitable thickness may alternatively be utilized.

Figure 3:
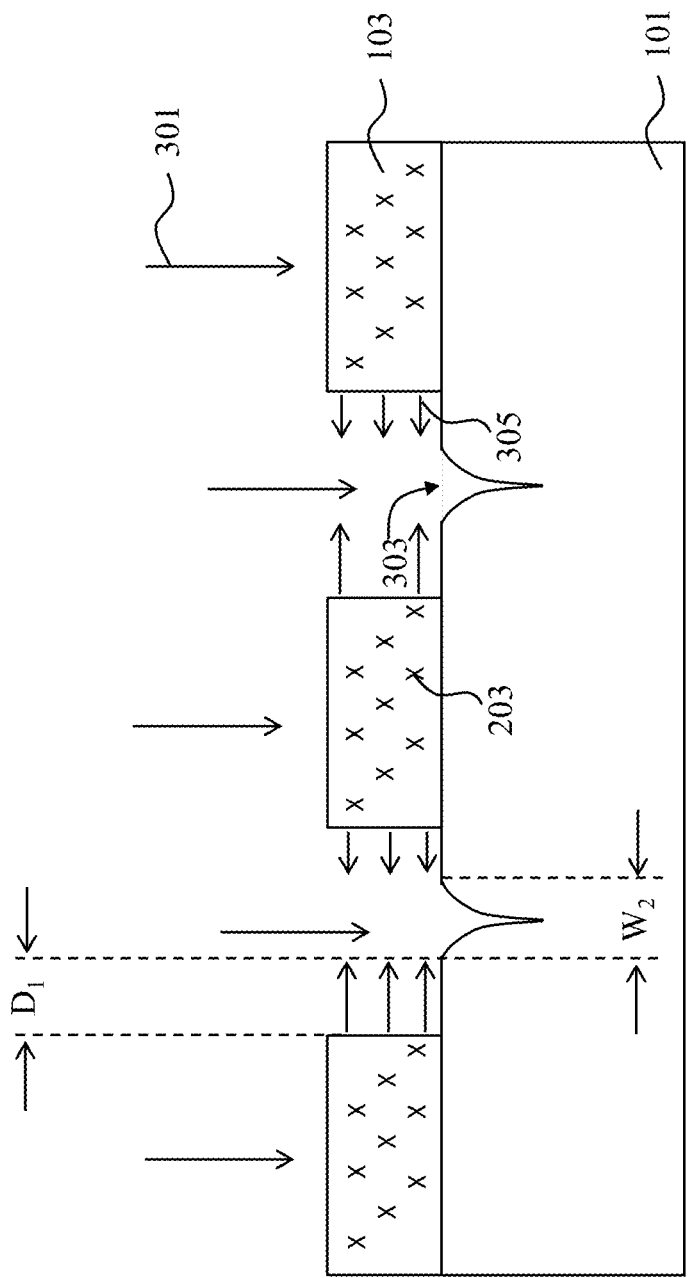
FIG. 3 illustrates a patterning of the substrate using the mask material as a lens in accordance with some embodiments.

FIG. 3 illustrates a removal process that utilizes a second irradiation (represented in FIG. 3 by the arrows labeled 301) to remove portions of the substrate 101 through the first mask material 103. In an embodiment the second irradiation process 301 may be similar to the first irradiation process 201 as by being a ion beam process that utilizes a charged ion such as gallium (as described above with respect to FIG. 2). However, any suitable irradiation process may alternatively be utilized.

During the second irradiation process 301, the first mask material 103 acts in two separate capacities in order to help pattern the substrate 101. In the first capacity, the first mask material 103 works as a physical barrier over those portions of the substrate 101 covered by the first mask material 103. In this respect, the first mask material 103 works as a mask to physically prevent the charged ions from reaching the substrate 101 by covering the substrate 101.

Secondly, with the presence of the charged ions 203 located within the first region 111 of the first mask material 103, the charged ions 203 and the force (represented in FIG. 3 by the arrows labeled 305) that the charged ions 203 will exert upon similarly charged ions (e.g., the ions being used in the second irradiation process 301), will work as a lens in order to further focus the ion beam of the second irradiation process 301 into an even more narrow area. Such a lens effect will work to further enhance the ability to pattern smaller regions, even if the desired size is unattainable by photolithographic processes.

By using the physical masking along with the lens effect of the first mask material 103, the substrate 101 may be patterned to form, e.g., second openings 303. In an embodiment the second openings 303 may have a second width $W_2$ at a top of the second openings 303 that is less than the first width $W_1$ (of the first opening 107 through the patterned material 105). As such, in an embodiment in which the first openings 107 are less than about 200 nm, the second width $W_2$ is less than about 100 nm. Additionally, the second openings 303 may be tapered downwards as the second openings 303 extend into the substrate 101 such that the bottom of the second openings 303 may have a width of less than about 10 nm.

Given this, the second openings 303 may be offset from the first mask material 103 a first distance $D_1$ that is one half of the difference between the first width $W_1$ and the second width $W_2$. For example, in an embodiment in which the first openings 107 are about 200 nm and the second openings 303 are about 100 nm, the first distance $D_1$ would be about 50 nm ((200 nm–100 nm)/2). However, any suitable distance may alternatively be utilized.

By forming the self-focused ion beam by the charged dielectric lens, a feature size smaller than the spot size of the ion beam may be achieved without the need for a focused ion beam. As such, a larger beam spot size and a larger beam current may be utilized, allowing for a faster removal over a larger area, which allows a large area of the substrate 101 to be fabricated with a higher throughput than using a focused ion beam lithography process.

Figure 4:
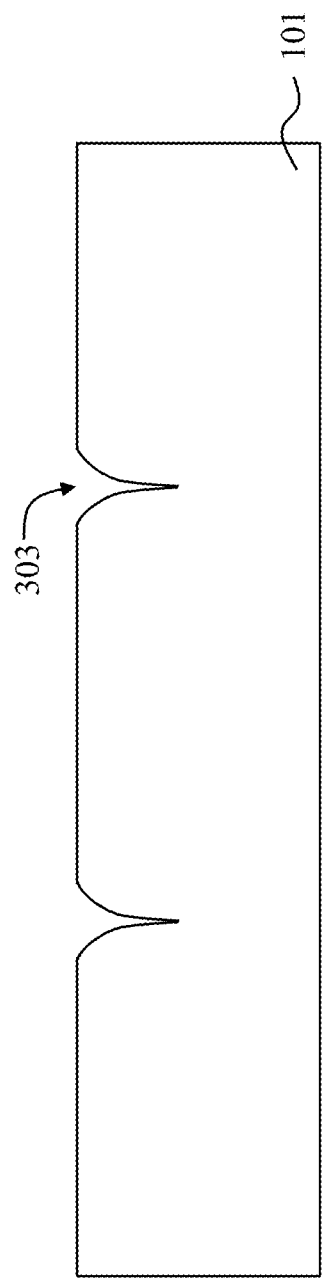
FIG. 4 illustrates a removal of the mask material in accordance with some embodiments.

FIG. 4 illustrates a removal of the first mask material 103 from the substrate 101, thereby leaving behind the second openings 303 as part of the now patterned substrate 101. In an embodiment the first mask material 103 may be removed using one or more etching processes, such as a wet etch utilizing an etchant selective to the material of the first mask material 103. As such, while the precise etchant or etchants may be dependent at least in part upon the material of the first mask material 103, in an embodiment in which the first mask material 103 is aluminum oxide, the aluminum oxide may be removed with a wet etch process and an etchants such as a dilute HF solution or $BCl_3$. However, any suitable removal process may alternatively be utilized.

By forming the first mask material 103 to work as both a physical mask as well as a lens in that is used to focus the ion beams of the second irradiation process 301, a more focused ion beam may be achieved. This more focused beam will allow for a further reduction in the size of the openings (e.g., the second openings 303) that may be obtained. Such an obtainable reduction in the size of features can continue the reduction of devices, making overall devices smaller and smaller.

Once patterned, the second openings 303 may be used for further processing of the substrate 101. For example, in an embodiment in which the substrate 101 is a semiconductor material, dielectric material may be placed within the second openings 303 to form isolation regions. As another example, in an embodiment in which the substrate 101 is a dielectric material, the second openings 303 may be filled with a conductive material to form electrical routings. However, any suitable processing may be performed after the patterning of the substrate 101 to form the second openings 303, and all such processes are fully intended to be included within the scope of the embodiments.

Figure 5:
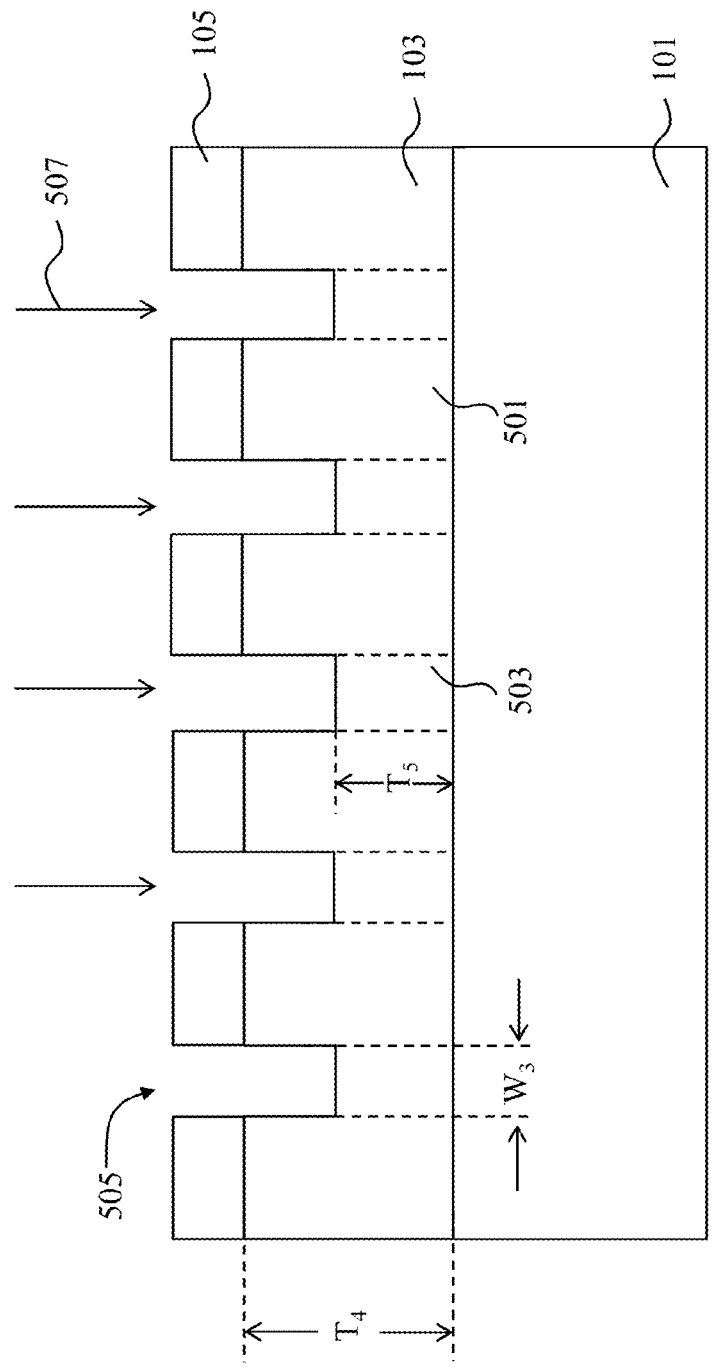
FIG. 5 illustrates a patterning of a mask material over the substrate in accordance with some embodiments.

FIG. 5 illustrates another embodiment in which the first mask material 103 is initially formed over the substrate 101. In this embodiment, however, rather than using the first transfer process 109 by itself to pattern the first mask material 103, the first transfer process 109 is utilized along with a reshaping process (not illustrated in FIG. 5, but represented in FIGS. 6A-6C by the arrows labeled 601) in order to form a separate, final shape of the first mask material 103, which process may be called a self-shrinking dielectric mask scanning ion beam lithography (SSDM-SIBL) in some embodiments. In this embodiment the first mask material 103 may be initially formed over the substrate 101 as described above with respect to FIG. 1. However, in order to account for the reshaping process 601, in this embodiment the first mask material 103 is formed to a fourth thickness $T_4$ of between about 100 nm and about 300 nm.

Once the first mask material 103 has been formed over the substrate 101, the patterned material 105 may be placed and patterned over the first mask material 103 in preparation for a patterning of the first mask material 103 into a third region 501 and a fourth region 503 (separated from each other within the first mask material 103 by the dashed lines). In this embodiment the patterned material 105 may be patterned to form third openings 505 with a third width $W_3$ that is obtainable using photolithographic processes, such as by being between about 20 nm and about 500 nm, such as about 300 nm or 130 nm.

Additionally, once the patterned material 105 has been placed and patterned, the patterned material 105 is used as a mask to transfer the pattern the pattern of the photosensitive material to the first mask material 103 and form the third region 501 and the fourth region 503. In an embodiment the second transfer process 507 may be performed similar to the first transfer process 109 as described above with respect to FIG. 1. For example, an ion milling process, a reactive ion etch, or a milling process without the patterned material 105 may be utilized to transfer the pattern of the patterned material 105 to the first mask material 103.

The second transfer process 507 works to remove a portion of the first mask material 103 to form the fourth regions 503 without exposing the underlying substrate 101. Additionally, in order to provide support for the subsequent reshaping process 601 and to ensure that the material within the fourth regions 503 is not removed during the reshaping process 601, the second transfer process 507 may be continued (using, e.g., the timed etch process) until the first mask material 103 within the fourth regions 503 has a fifth thickness $T_5$ that is less than the fourth thickness $T_4$ but not less than one-half of the thickness of the fourth thickness $T_4$. For example, in an embodiment in which the fourth thickness $T_4$ is 300 nm, the fifth thickness $T_5$ is less than 300 nm but greater than or equal to 150 nm. In a particular embodiment the third openings 505 within the first mask material 103 may have a V-shaped profile, such that the third openings 505 within the first mask material 103 may have a width of, e.g., 145 nm at a top of the third openings 505 within the first mask material 103 and, because of redeposition effects, may have a width at a bottom of the third openings 505 of about 83 nm.

Figure 6A:
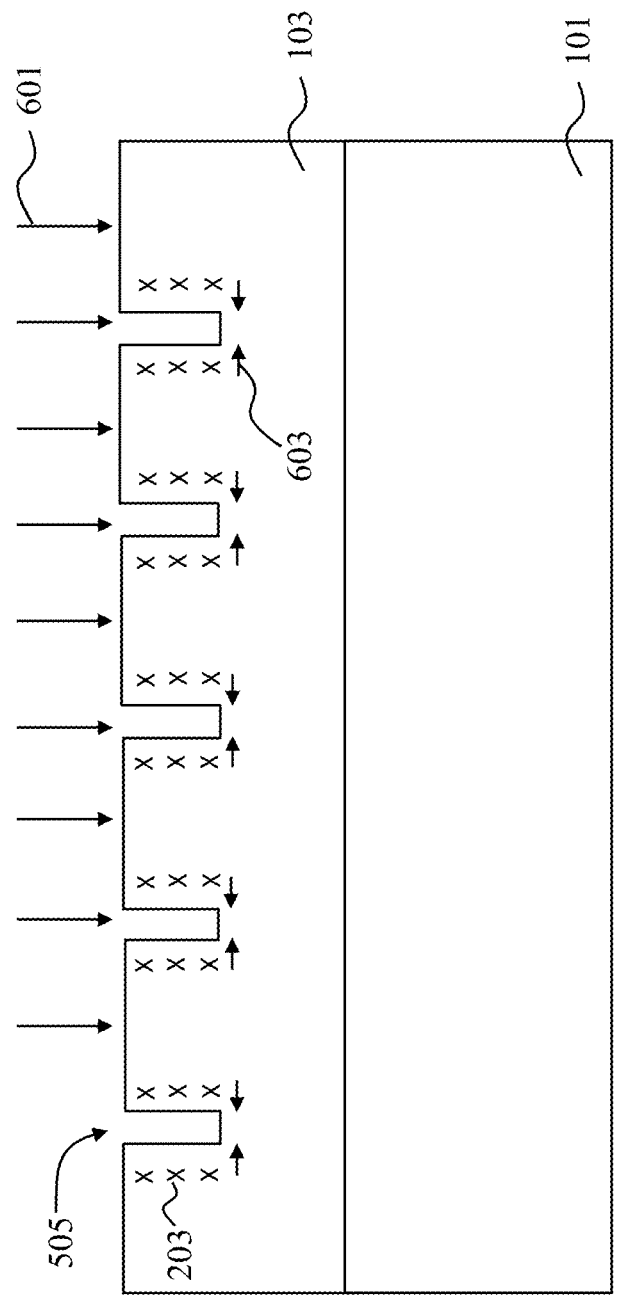
FIGS. 6A-6B illustrate a reshaping of the mask material in accordance with some embodiments.
Figure 6B:
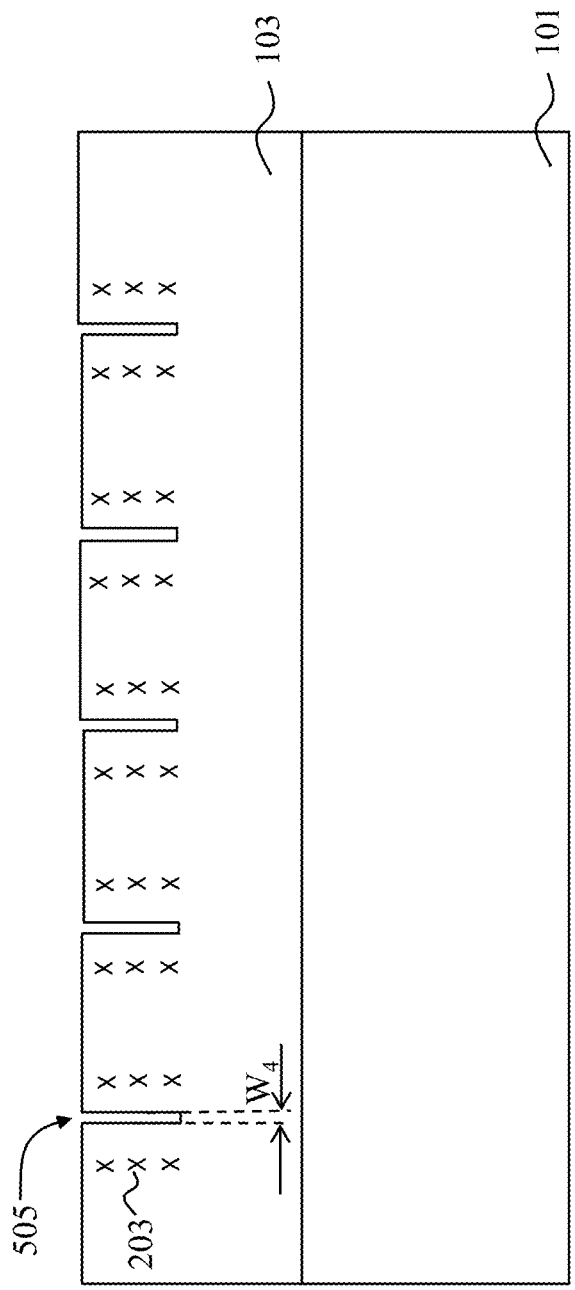

FIGS. 6A-6B illustrate one embodiment of the reshaping process 601 (which may also be called a self-shrinking process) that is utilized to reshape the first mask material 103 after the formation of the third openings 505, with FIG. 6A illustrating an intermediate structure and FIG. 6B illustrating one possible final structure for the reshaping process 601. In an embodiment the reshaping process 601 will reshape the first mask material 103 from its shape after the second transfer process 507 (which, while illustrated in FIG. 5 as a squared shaped may actually have a V-shaped geometry), to a more straight nanogap with a high aspect ratio. In an embodiment the reshaping process 601 utilizes a third irradiation process that may be similar to the first irradiation process 201 (described above with respect to FIG. 2). For example, the third irradiation process may irradiate the first mask material 103 with charged ions such as gallium with an implantation energy of between about 50 KeV and about 100 KeV, such as about 30 KeV, a scanning area of about 3600 $\mu m^2$, and a beam current of between about 40 picoampere (pA) and 60 nA, such as about 2.5 nA. However, any suitable process parameters may be utilized.

However, because of the thickness of the fourth region 503, in this embodiment there is no immediate breakthrough that will expose the underlying substrate 101. Further, without such a breakthrough to the substrate 101, the continuation of the reshaping process 601 (e.g., the third irradiation process) will cause heat to build up within the first mask material 103. When the temperature of the first mask material 103 (including the implanted charged ions) reaches a melting point of the material of the first mask material 103, the first mask material 103 will begin to reshape itself. In an embodiment in which the first mask material 103 is aluminum oxide, the temperature of the first mask material 103 will begin to reshape at a temperature greater than the melting point of aluminum oxide, such as about 2000° C. with an error of about 30° C., and the reshaping process 601 may be continued for a time period of about 5 minutes, although the precise time would be dependent at least in part upon the process parameters utilized.

As the reshaping process 601 causes the material of the first mask material 103 to reshape, the third openings 505 will begin to reduce in width, becoming smaller and smaller. However, because the reshaping process 601 is also implanting the charged ions 203 into the third regions 501, subsequent charged ions 203 will automatically be focused toward the center of the third openings 505 due to the repulsive force from the charged first mask material 103. As such, even though the milling spot size for a beam current of about 2.5 nA is about 133 nm, the spot size through the first mask material 103 may be reduced down to a smaller size to obtain, e.g., a gap linewidth (further discussed in FIG. 8 below) of as small as 2.7 nm or 2.9 nm.

Additionally, the charged ions 203 within the third regions 501 (which are now reshaping to be closer to each other) will exert a force (represented in FIG. 6A by the arrow labeled 603) against the charged ions 203 in the opposing side of the third opening 505. This force 603 from the charged ions 203, along with the ion beam itself, works to keep the first mask material 103 from agglomerating too fast due to the repulsive forces between the opposite sides and keeps the third opening 505 from completely closing during the reshaping process 601.

FIG. 6B illustrates one end result of the reshaping process 601. In this embodiment the reshaping process 601 will reshape the third openings 505 into a new trench shape with a different width. For example, the reshaping process 601 will reshape the third openings 505 into a trench shape with a fourth width $W_4$ of between about 2.7 nm and about 9 nm, such as about 5.4 nm, 5 nm, 2.9 nm or 2.1 nm. However, any suitable width may alternatively be utilized.

Figure 7:
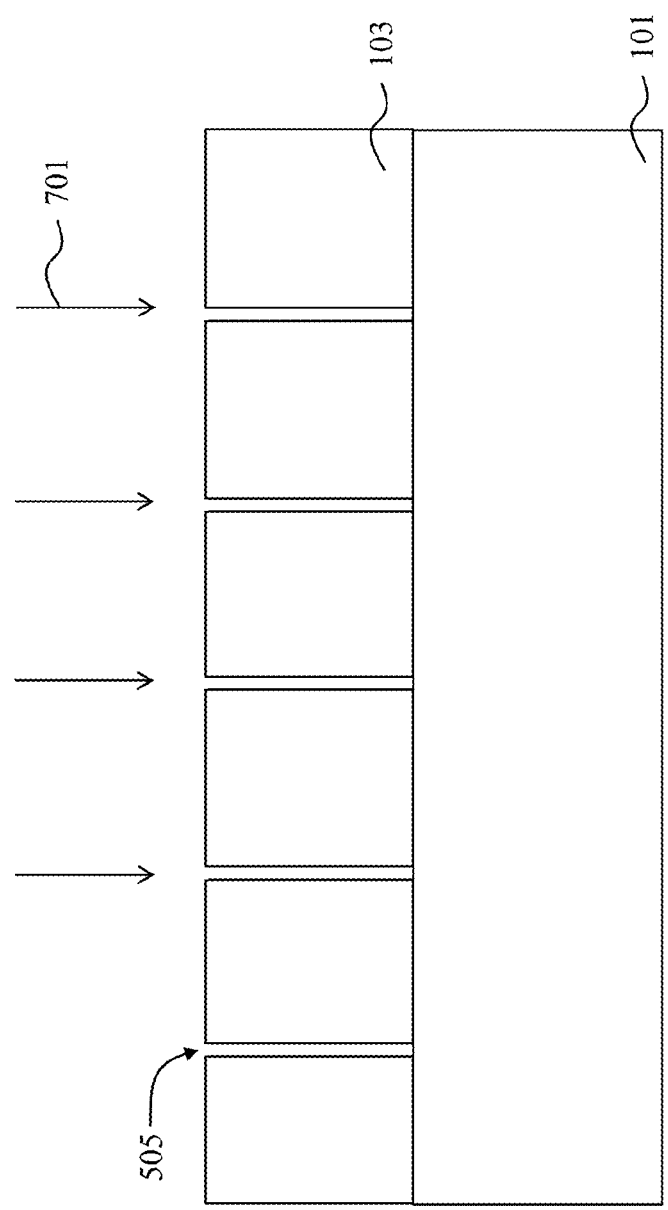
FIG. 7 illustrates an extension of openings within the mask material in accordance with some embodiments.

FIG. 7 illustrates that, once the third openings 505 have been reshaped, the third openings 505 (with the fourth width $W_4$) may be utilized as a mask along with a third transfer process (represented in FIG. 7 by the arrows labeled 701) in order to transfer the pattern of the third openings 505 through a remainder of the first mask material 103. In an embodiment the third transfer process 701 may be a continuation of the reshaping process 601, but now with the third openings 505. For example, the reshaping process 601 will be a continuous process that proceeds to extend the third openings 505 deeper into the first mask material 103 even as a remainder of the first mask material 103 is being reduced outside of the third openings 505. The third transfer process 701 may be continued until the underlying substrate 101 has been exposed.

FIG. 8 illustrates that, once the substrate 101 has been exposed, a fourth transfer process (represented in FIG. 8 by the arrows labeled 801) may be utilized to extend the third openings 505 (which now extend through the first mask material 103) and form fourth openings 803 (illustrated in FIG. 8 as being separated from the third openings 505 by a dashed line) into the substrate 101. In an embodiment the fourth transfer process 801 may be a simple continuation of the reshaping process 601 (described above with respect to FIGS. 6A-6B). For example, the fourth transfer process 801 will use a continuation of the Ga ion beam in order to remove the material of the substrate 101. In another embodiment the fourth transfer process 801 may be a reactive ion etching process utilizing etchants selective to the substrate 101 and using the first mask material 103 as an etching mask. Any suitable transfer process may be utilized.

By utilizing the reshaping process 601 to reshape the third openings 505 into a smaller width (e.g., the fourth width $W_4$), the fourth openings 803 may be formed into the substrate 101 with, e.g., the fourth width $W_4$ that is smaller than may be achievable with a photolithographic masking and etching process by itself. Additionally, the fourth openings 803 may be formed to extend into the substrate a second distance $D_2$ of between about 50 nm and about 200 nm, resulting in a high aspect ratio as large as greater than 30 in the sub-10 nm scale. For example, in a particular embodiment, the fourth openings 803 may be made with a fourth width $W_4$ of 9.2 nm and a second distance $D_2$ of 280.5 nm, with an aspect ratio of about 30.4. As such, the fourth openings 803 may have a relatively straight sidewalls and a relatively constant width throughout the fourth openings 803.

Additionally, by reshaping the first mask material 103, a pattern down to about 2.7 nm can be achieved using a higher beam current (such as 2.5 nA, which usually has a resolution no better than 130 nm), which allows for a larger rate of removal than, e.g., a 1.1 pA beam current with a 7 nm spot size. In particular, a milling time for ion beam milling may be expressed by the following equation:

$$T = \frac{V}{IB}$$

Wherein: T=Milling Time
V=Sputtered Volume
I=Beam Current
B=Material Dependent Sputter Rate With this equation, as a result, by using a more than two thousand times larger beam current (2.5 nA versus 1.1 pA), there is a savings of over 99.9% of time when fabricating sub-10 nm patterns.

Additionally, by using such a large scanning area (e.g., 3600 µm² such as 3570 µm²), a large area of the substrate 101 may be irradiated by the ion beam simultaneously instead of using sequential line-by-line writing as in other focused ion beam processes. In a particular embodiment, a nanoline array with sub-10 nm gap widths may be formed in about 10 minutes, which is over 3000 times more rapid than line-by-line writing. With such a large area simultaneously irradiated, a myriad of nanopatterns may be formed simultaneously as long as the nanopatterns are within the scanning area of the ion beam. As such, process time may be saved and the overall throughput may be increased. Also, because the process is self-focusing, the focusing functionality of the ion beam machine used is not as important, so a cost for a machine may be lower than current focused ion beam and extreme ultraviolet lithography (EUV) machines.

FIG. 9 illustrates a removal of the first mask material 103 from the substrate 101, thereby leaving behind the fourth openings 803 as part of the now patterned substrate 101. In an embodiment the first mask material 103 may be removed using one or more etching processes, such as a wet etch utilizing an etchant selective to the material of the first mask material 103. As such, while the precise etchant or etchants may be dependent at least in part upon the material of the first mask material 103, in an embodiment in which the first mask material 103 is aluminum oxide, the aluminum oxide may be removed with a wet etch process and an etchants such as a dilute HF solution. However, any suitable removal process may alternatively be utilized.

Once patterned, the fourth openings 803 may be used for further processing of the substrate 101. For example, in an embodiment in which the substrate 101 is a semiconductor material, dielectric material may be placed within the fourth openings 803 to form isolation regions. As another example, in an embodiment in which the substrate 101 is a dielectric material, the fourth openings 803 may be filled with a conductive material to form electrical routings. However, any suitable processing may be performed after the patterning of the substrate 101 to form the fourth openings 803, and all such processes are fully intended to be included within the scope of the embodiments.

Figure 10B:
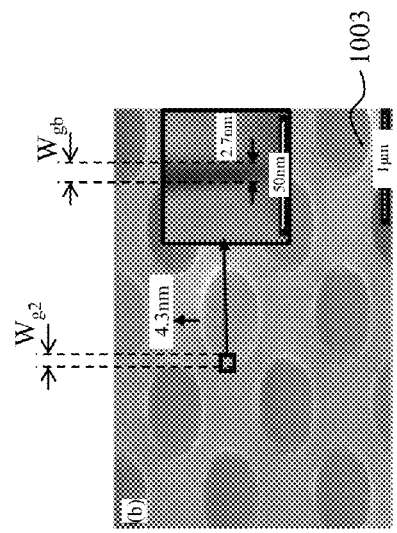
FIGS. 10A-12B illustrate embodiments of shapes that may be formed using the reshaping of the mask material.
Figure 10A:
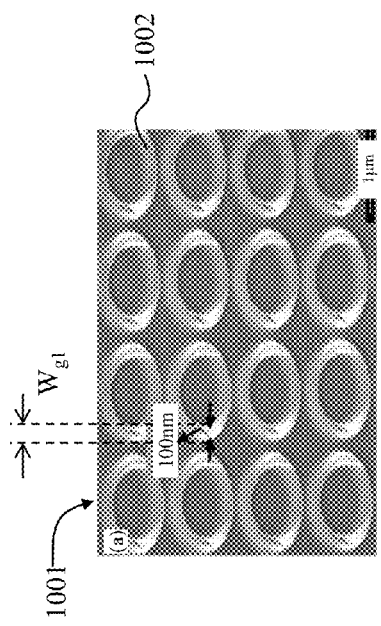

FIGS. 10A-10B illustrate an embodiment of the reshaping process 601 which may be utilized to form a first array 1001 that comprises a plurality of reduced circular shapes 1003. In this embodiment, as shown in FIG. 10A, initial circular shapes 1002 may be formed within the first mask material 103 to have a first gap width $W_{g1}$ of about 100 nm before the reshaping process 601 is utilized. After the reshaping process has been used, as seen in FIG. 10B, the reduced circular shapes 1003 may have a second gap width $W_{g2}$ of 4.3 nm at the top and, as seen in the cross-sectional insert, a bottom gap width $W_{gb}$ of 2.7 nm.

Figure 11B:
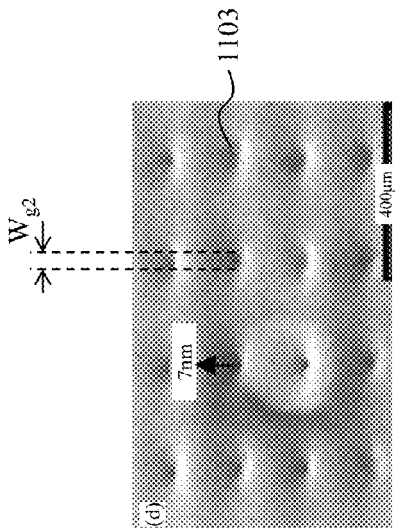
Figure 11A:
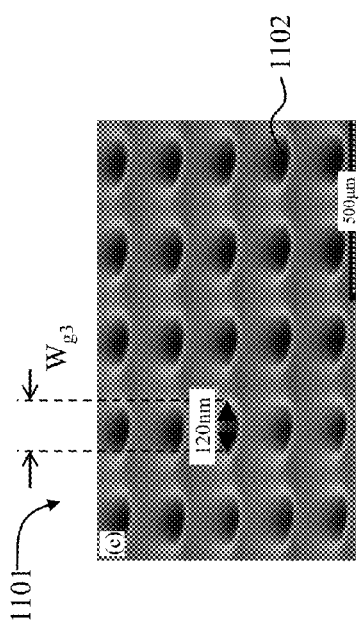

FIGS. 11A-11B illustrate an embodiment of the reshaping process 601 which may be utilized to form a second array 1101 that comprises a plurality of reduced nanoholes 1103. In this embodiment, as shown in FIG. 11A, initial nanoholes 1102 may be formed within the first mask material 103 to have third gap width $W_{g3}$ of about 120 nm before the reshaping process 601 is utilized. After the reshaping process 601 has been used, as seen in FIG. 11B, the reduced nanoholes 1103 may be shrunk to have a fourth gap width $W_{g4}$ of about 7 nm.

Figure 12B:
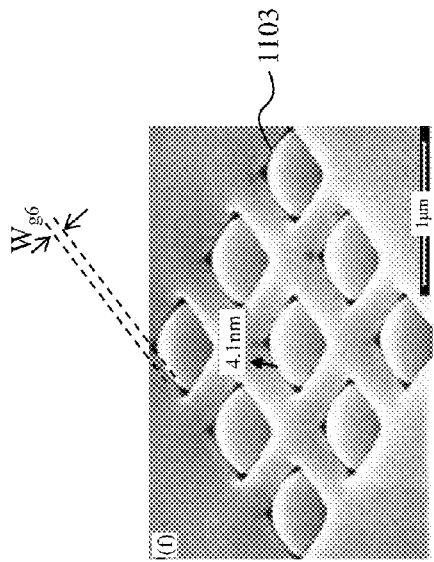
Figure 12A:
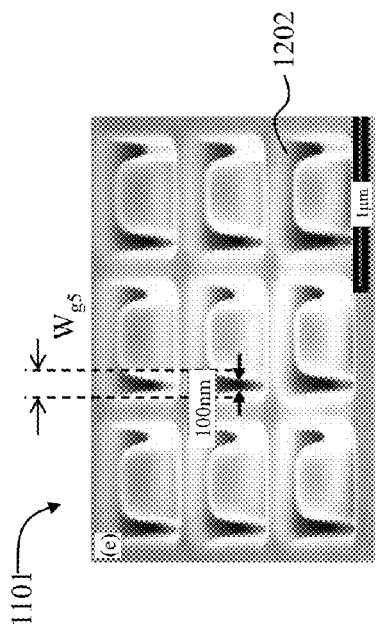

FIGS. 12A-12B illustrate an embodiment of the reshaping process 601 which may be utilized to form a third array 1201 that comprises a plurality of reduced square shapes 1203. In this embodiment, as shown in FIG. 12A, initial square shapes 1202 may be formed within the first mask material 103 to have a fifth gap width $W_{g5}$ of about 100 nm. After the reshaping process 601 has been used, as seen in FIG. 12B, the reduced square shapes 1203 may be shrunk to have a sixth gap width $W_{gb}$ of about 4.1 nm.

By using the processes described herein, small size openings may be manufactured for a wide variety of uses. For example, in some embodiments the process may be used to define a sub-10 nm gate length in a junctionless silicon transistor on a silicon-on-insulator substrate with a current on/off ratio of $3 \times 10^4$. In other embodiments, the process may be used in other nanoelectronics, nanophotonics, micromechanical, and biological applications. Any suitable applications may be utilized along with the described embodiments.

In accordance with an embodiment, a method of manufacturing a semiconductor device comprising patterning a first mask material over a substrate to have a first opening, wherein the first mask material has a first thickness and the first opening has a first depth less than the first thickness is provided. The first mask material is irradiated with an ion beam after the patterning the first mask material to form an irradiated first mask material, and the substrate is patterned using the irradiated first mask material as a mask.

In accordance with another embodiment, a method of manufacturing a semiconductor device comprising applying a mask material to a substrate and patterning the mask material to form a first opening in the mask material is provided. The mask material is irradiated with charged ions to form a charged mask material, and the charged mask material is used as a lens to form an opening in the substrate.

In accordance with yet another embodiment, a method of manufacturing a semiconductor device comprising applying a mask material to a substrate is provided. The mask material is patterned with a photosensitive material over the mask material to form a first opening within the mask material, the first opening having a first width, and the first opening is reshaped to a second opening with a second width less than the first width. The substrate is patterned with the second opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method of manufacturing a semiconductor device, the method comprising:
   patterning a first mask material over a substrate to have a first opening having a first width, wherein the first mask material has a first thickness and the first opening has a first depth less than the first thickness;

irradiating the first mask material with an ion beam after the patterning the first mask material to form an irradiated first mask material, wherein the irradiating the first mask material reshapes the first mask material to form a second opening of the first mask material from the first opening of the first mask material, wherein the second opening of the first mask material has a second width smaller than the first width, and wherein the first width and the second width are measured at a same distance from the substrate; and patterning the substrate using the irradiated first mask material as a mask.

2. The method of claim 1, wherein the irradiating the first mask material exposes the substrate.

3. The method of claim 2, wherein the patterning the substrate is performed at least in part by irradiating the substrate using the irradiated first mask material as a lens.

4. The method of claim 1, wherein the first mask material comprises aluminum oxide.

5. The method of claim 1, wherein the irradiating the first mask material further comprises irradiating the first mask material with gallium ions.

6. A method of manufacturing a semiconductor device, the method comprising:

applying a mask material to a substrate;

patterning the mask material to form a first opening in the mask material;

irradiating the mask material with charged ions to form a charged mask material; and using the charged mask material as a lens to form an opening in the substrate.

7. The method of claim 6, wherein the mask material is aluminum oxide.

8. The method of claim 6, wherein the irradiating the mask material further comprises implanting gallium ions into the mask material.

9. The method of claim 8, wherein implanting gallium ions into the mask material implants the gallium ions to a concentration of between about 60.37 pC/μm$^2$ and about 603.68 pC/μm$^2$.

10. The method of claim 6, wherein the opening in the substrate has a width of less than about 10 nm.

11. The method of claim 6, wherein using the charged mask material as a lens to form the opening further comprises irradiating the substrate with a second ion beam.

12. The method of claim 11, wherein the irradiating the substrate with the second ion beam comprises irradiating the substrate with an ion beam of gallium.

13. A method of manufacturing a semiconductor device, the method comprising:

applying a mask material to a substrate;

patterning the mask material with a photosensitive material over the mask material to form a first opening within the mask material, the first opening having a first width;

reshaping the first opening to a second opening with a second width less than the first width, the second width being in a range between 2.7 nm and 9 nm; and patterning the substrate with the second opening.

14. The method of claim 13, wherein the patterning the mask material further comprises forming a first region of the mask material with a first thickness and a second region of the mask material with a second thickness less than the first thickness.

15. The method of claim 14, wherein the second thickness is less than about 9 nm.

16. The method of claim 13, wherein the reshaping the first opening further comprises irradiating the mask material with an ion beam.

17. The method of claim 16, wherein the ion beam comprises a gallium ion beam.

18. The method of claim 13, wherein the patterning the substrate with the second opening further comprising:

exposing the substrate by removing the mask material through the second opening; and removing the substrate through the second opening.

19. The method of claim 13, wherein the mask material is aluminum oxide.

20. The method of claim 13, wherein the substrate comprises an electrically conductive material.

* * * * *